United States Patent
Zambrano (10) Patent No.: US 6,579,727 B1
(45) Date of Patent: Jun. 17, 2003

(54) PROCESS FOR SELECTIVELY SEALING FERROELECTRIC CAPACITIVE ELEMENTS INCORPORATED IN SEMICONDUCTOR INTEGRATED NON-VOLATILE MEMORY CELLS

(75) Inventor: Raffaele Zambrano, Viagrande (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/710,066

(22) Filed: Nov. 9, 2000

(30) Foreign Application Priority Data

Nov. 10, 1999 (IT) .......................................... MI99A2350

(51) Int. Cl.⁷ .............................................. H01L 21/00
(52) U.S. Cl. ........................................... 438/3; 257/295
(58) Field of Search ................................. 257/295, 303, 257/306, 310, 758; 438/3, 239, 253, 622

(56) References Cited

U.S. PATENT DOCUMENTS

| 5,146,299 A | * | 9/1992 | Lampe et al. | 257/295 |
| 5,475,248 A | | 12/1995 | Takenaka | 275/295 |
| 5,481,490 A | | 1/1996 | Watanabe et al. | 365/145 |

(List continued on next page.)

FOREIGN PATENT DOCUMENTS

| DE | 196 40 246 A1 | 4/1998 |
| EP | 0 793 274 A1 | 9/1997 |
| EP | 0 837 504 A2 | 4/1998 |
| WO | WO 98/05071 | 2/1998 |

OTHER PUBLICATIONS

Yamazaki, T. et al., "Advanced 0.5μm FRAM Device Technology with Full Compatibility of Half–Micron CMOS Logic device," IEEE, pp. 25.5.1–25.5.4, XP000855871, Dec. 1997.

*Primary Examiner*—Steven Loke
*Assistant Examiner*—Quang Vu
(74) *Attorney, Agent, or Firm*—Lisa K. Jorgenson; Robert Iannucci; Seed IP Law Group PLLC (57) ABSTRACT

A process for selectively sealing ferroelectric capacitive elements in non-volatile memory cells being integrated in a semiconductor substrate and comprising at least one MOS transistor, which process comprises at least the following steps: forming said at least one MOS transistor on the semiconductor substrate, and depositing an insulating layer over the whole surface of the semiconductor; and further comprises the steps of: depositing a first metal layer to form, using a photolithographic technique, a lower electrode of at least one ferroelectric capacitive element; depositing a layer of a dielectric material onto said first layer; depositing a second metal layer to form, using a photolithographic technique, an upper electrode of at least one ferroelectric capacitive element; depositing a layer of a sealing material onto said second metal layer; defining the dielectric material layer and sealing layer by a single photolithographic defining step, so as to pattern said dielectric layer and concurrently seal said at least one capacitive element.

22 Claims, 4 Drawing Sheets

U.S. PATENT DOCUMENTS

| | | | | |
|---|---|---|---|---|
| 5,578,867 A | | 11/1996 | Argos, Jr. et al. | 257/632 |
| 5,638,319 A | | 6/1997 | Onishi et al. | 365/145 |
| 5,716,875 A | | 2/1998 | Jones, Jr. et al. | 438/3 |
| 5,750,419 A | | 5/1998 | Zafar | 438/3 |
| 5,811,847 A | | 9/1998 | Joshi et al. | 257/296 |
| 5,864,153 A | | 1/1999 | Nagel et al. | 257/296 |
| 5,956,594 A | * | 9/1999 | Yang et al. | 438/396 |
| 5,965,942 A | * | 10/1999 | Itoh et al. | 257/295 |
| 5,973,342 A | | 10/1999 | Nakamura | 257/295 |
| 5,981,382 A | | 11/1999 | Konecni et al. | 438/646 |
| 5,990,507 A | * | 11/1999 | Mochizuki et al. | 257/295 |
| 5,994,153 A | * | 11/1999 | Nagel et al. | 438/3 |
| 5,998,296 A | | 12/1999 | Saran et al. | 438/685 |
| 6,037,252 A | | 3/2000 | Hillman et al. | 438/637 |
| 6,043,529 A | | 3/2000 | Hartner et al. | 257/306 |
| 6,051,858 A | | 4/2000 | Uchida et al. | 257/295 |
| 6,075,264 A | | 6/2000 | Koo | 257/295 |
| 6,091,599 A | * | 7/2000 | Amamiya | 361/311 |
| 6,121,083 A | | 9/2000 | Matsuki | 438/254 |
| 6,180,974 B1 | * | 1/2001 | Okutoh et al. | 257/306 |
| 6,194,311 B1 | * | 2/2001 | Nakajima | 438/3 |
| 6,197,631 B1 | * | 3/2001 | Ishihara | 438/3 |
| 6,239,460 B1 | * | 5/2001 | Kuroiwa et al. | 257/306 |
| 6,281,537 B1 | * | 8/2001 | Kim | 257/295 |
| 6,313,539 B1 | * | 11/2001 | Yokoyama et al. | 257/295 |
| 6,355,952 B1 | * | 3/2002 | Yamoto et al. | 438/3 |
| 6,358,755 B1 | * | 3/2002 | Evans | 438/3 |

\* cited by examiner

PROCESS FOR SELECTIVELY SEALING FERROELECTRIC CAPACITIVE ELEMENTS INCORPORATED IN SEMICONDUCTOR INTEGRATED NON-VOLATILE MEMORY CELLS

TECHNICAL FIELD

This invention relates to a process for selectively sealing ferroelectric capacitive elements incorporated in semiconductor integrated non-volatile memory cells.

The invention relates, particularly but not exclusively, to a process for fabricating ferroelectric capacitive elements of non-volatile memory cells of the ferroelectric type and stacked configuration, and the description to follow makes reference to this field of application for simplicity's sake only.

BACKGROUND OF THE INVENTION

As is well known, electronic semiconductor ferroelectric non-volatile memory devices comprise pluralities of ferroelectric non-volatile memory cells organized into a matrix array. This means that the cells would be laid in rows or wordlines, and columns or bitlines.

Each ferroelectric non-volatile memory cell comprises a MOS transistor and a ferroelectric capacitive element.

Conventional processes for making such memory cells comprise providing an insulating layer over the entire chip surface, after the MOS transistor has been integrated in a semiconductor substrate. The ferroelectric capacitive element is then formed on top of that insulating layer.

The capacitive element is conventionally provided with a metal lower electrode laid onto the insulating layer.

A layer of a ferroelectric material covers the lower electrode, and a metal upper electrode is laid onto the ferroelectric layer.

However, the presence of hydrogen during subsequent steps to the formation of the ferroelectric capacitive element may affect the ferroelectric material layer, causing its chemio-physical properties, and hence its electric characteristics, to deteriorate.

A prior approach to sealing the ferroelectric capacitive element provides for the use of an insulating layer which is impermeable to hydrogen in a selective way, that is, it is impermeable only in those regions which contain the capacitive element. In fact, hydrogen is a requisite if the electric characteristics of MOS transistors are to be stabilized.

While being in many ways an effective one, this prior approach involves a whole series of dedicated process steps.

SUMMARY OF THE INVENTION

An embodiment of this invention provides a process for selectively sealing ferroelectric capacitive elements with such features that the ferroelectric layer can be protected without introducing any additional process steps, thereby overcoming the limitations and drawbacks which still beset prior art processes.

The process selectively seals ferroelectric capacitive elements, wherein the dielectric layer and the sealing layer are defined in one process step.

Specifically, the process selectively seals ferroelectric capacitive elements incorporated in non-volatile memory cells being integrated in a semiconductor substrate and comprising at least one MOS transistor. The process includes the following steps: forming said at least one MOS transistor on the semiconductor substrate, depositing an insulating layer over the whole surface of the semiconductor, forming a ferroelectric layer between first and second metal electrodes, forming a sealing layer on the second metal electrode, and defining the sealing layer and ferroelectric layer using a photolithographic process.

The features and advantages of the process according to the invention will be apparent from the following description of an embodiment thereof, given by way of example and not of limitation with reference to the accompanying drawings.

DETAILED DESCRIPTION OF THE INVENTION

With reference to the drawings, a process for sealing a ferroelectric capacitor in non-volatile memories, according to an embodiment of the invention, is as described herein below.

Figure 1:
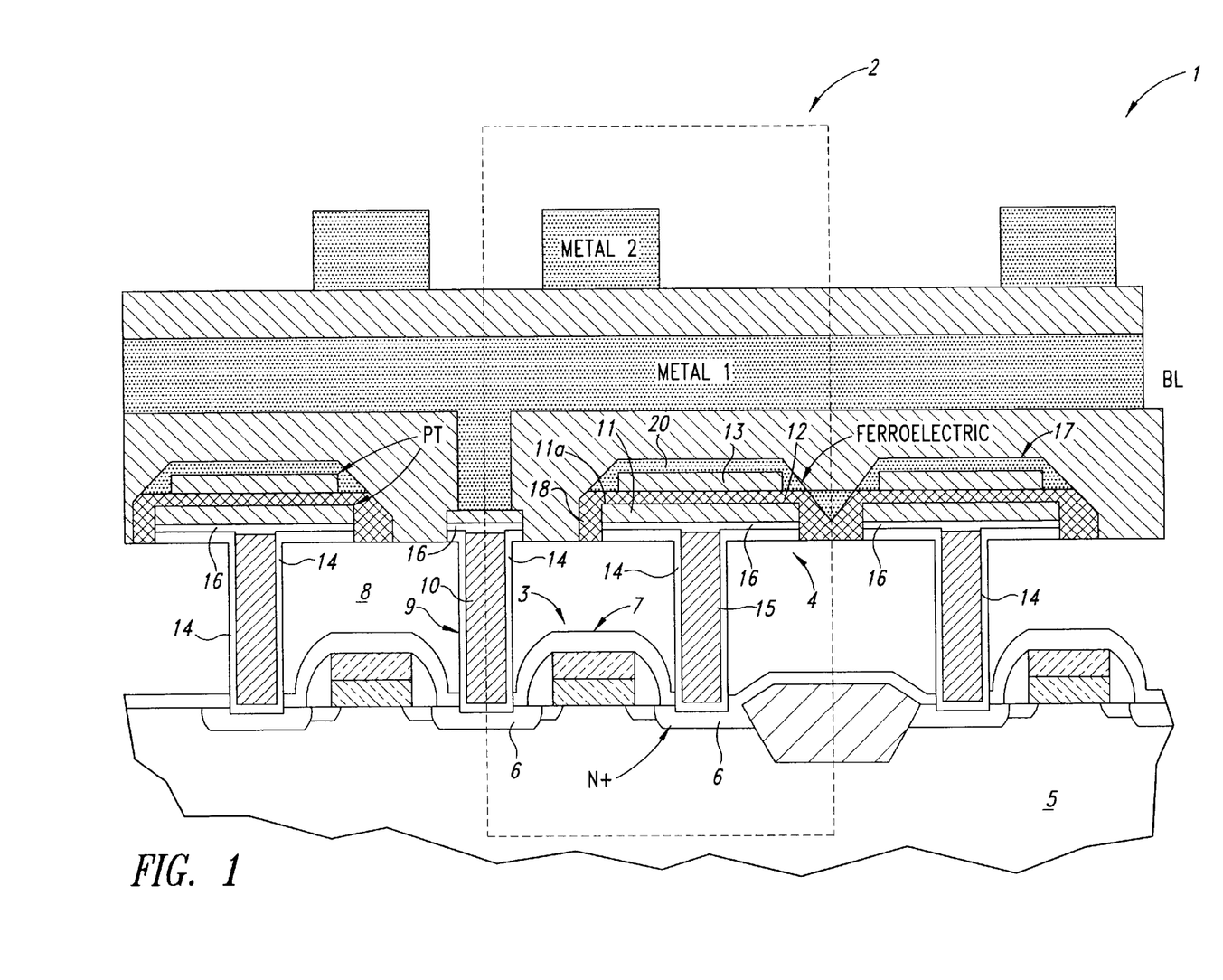
FIGS. 1 to 4 are sectional views of certain portions of a semiconductor substrate where a plurality of ferroelectric memory cells, incorporating a capacitive element in accordance with the sealing process of this invention, have been formed.
Figure 2:
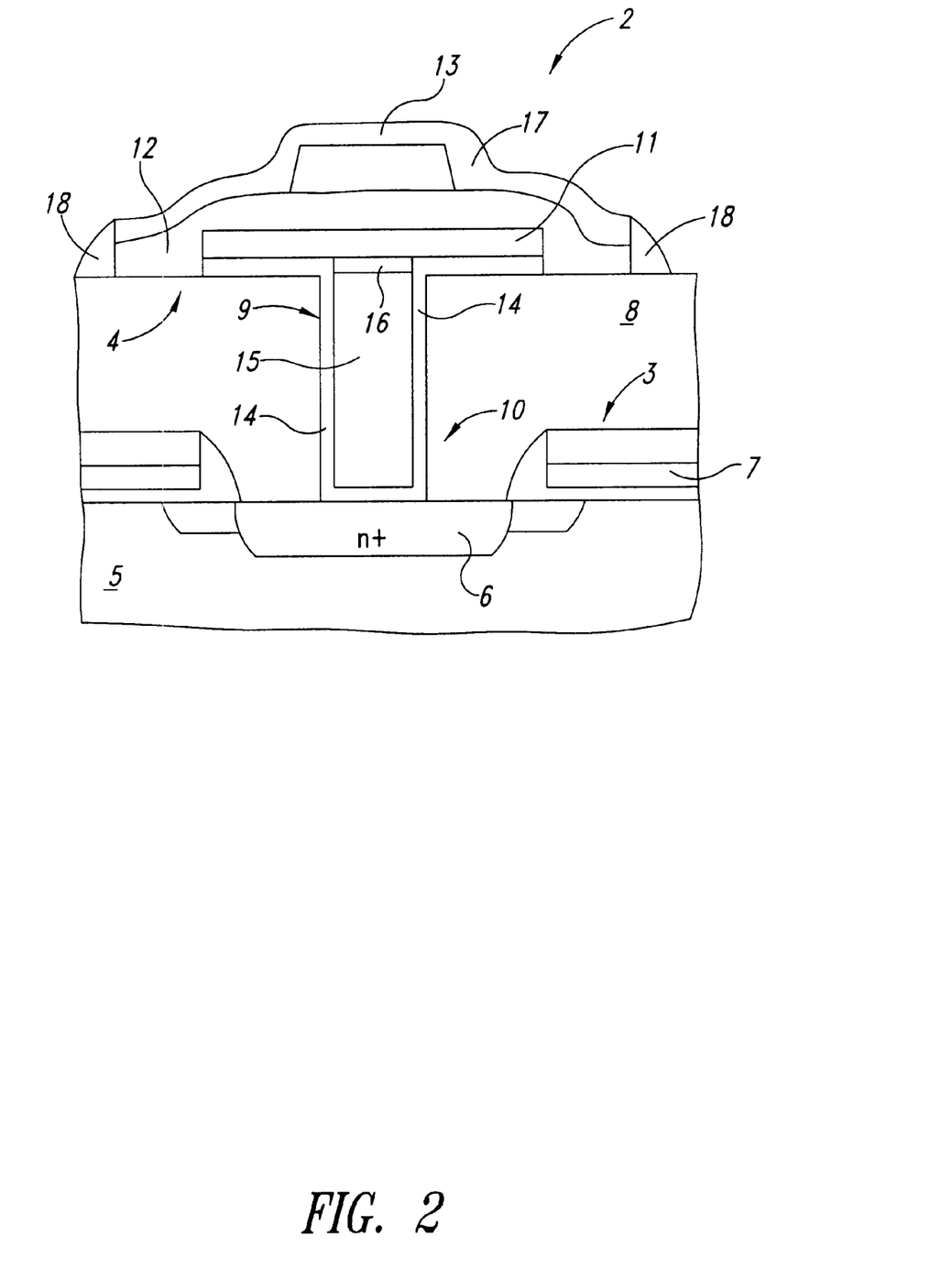
Figure 3:
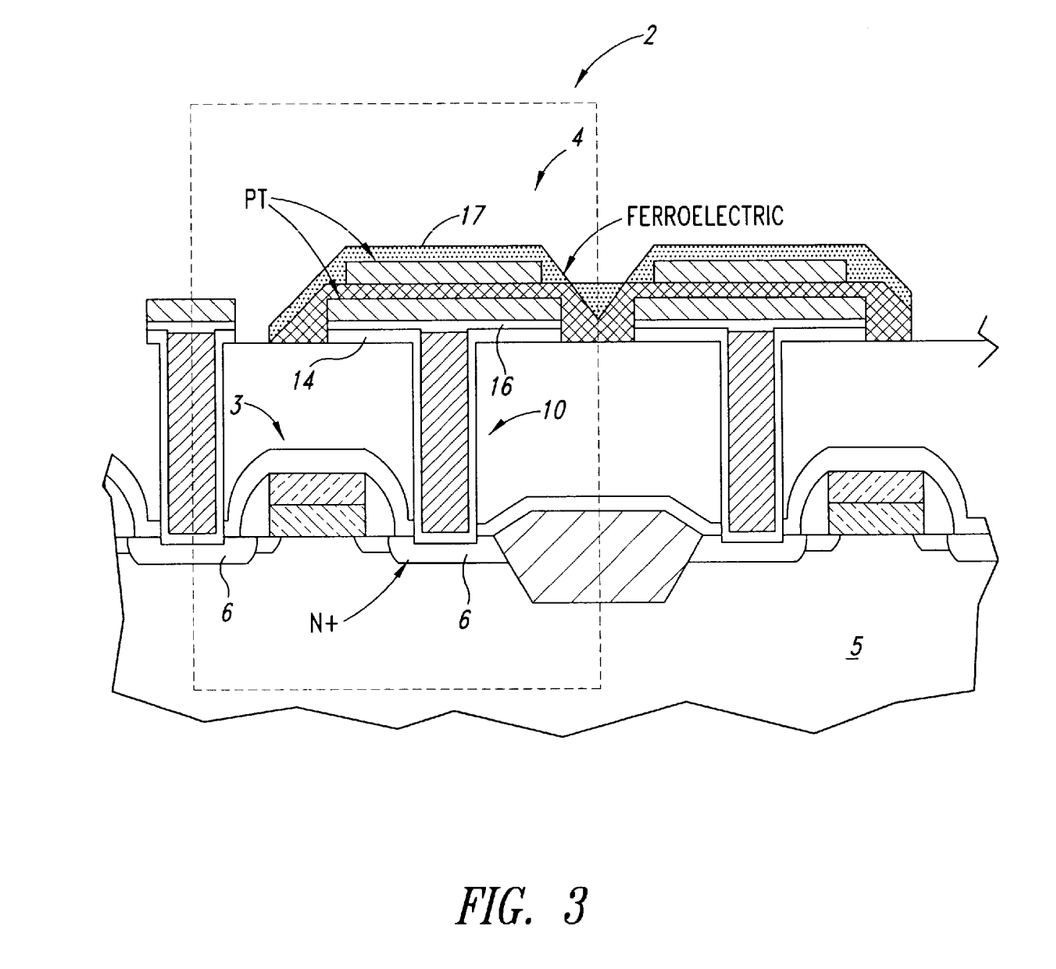
Figure 4:
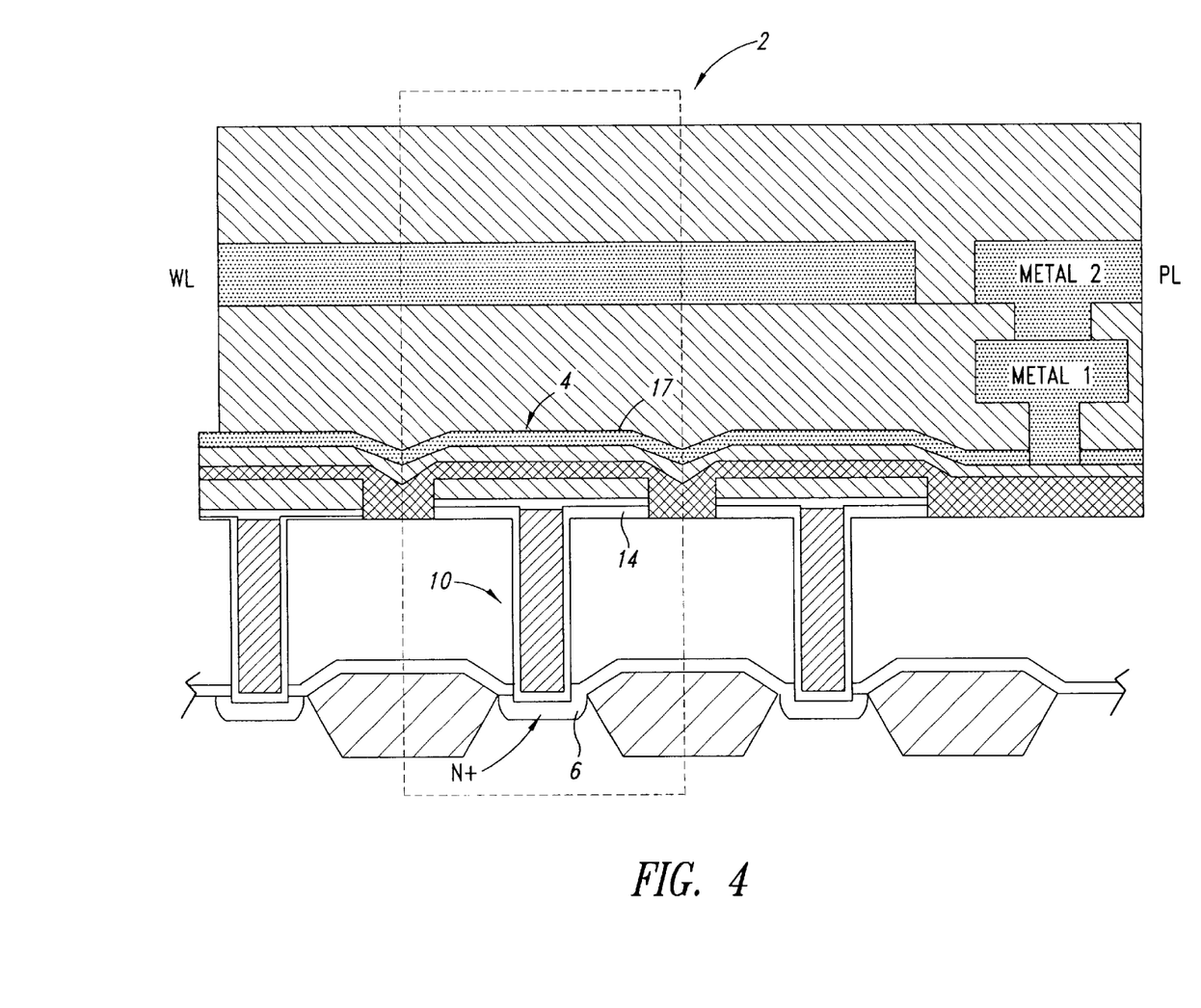

An electronic semiconductor memory device of the ferroelectric type comprises a plurality of non-volatile memory cells 2 organized into a matrix array 1, meaning that the cells are laid in rows or wordlines WL, and columns or bitlines BL, as shown in FIG. 1.

Each ferroelectric memory cell 2 comprises: a MOS transistor 3 connected in series with a ferroelectric capacitive element 4. Specifically, one end of the ferroelectric capacitive element is connected to a conduction terminal of the transistor 3.

The plurality of memory cells 2 are univocally identified by intersections of the bitlines and the wordlines.

Referring to the drawing views, a set of MOS transistors 3 are formed on the semiconductor substrate 5. Each MOS transistor 3 has first and second conduction terminals 6, 6A which are both formed in respective source and drain regions of the substrate.

A gate (control) electrode 7 of polysilicon overlies that region of the substrate which extends between pairs of the conduction terminals 6, and is isolated from the surface of the substrate 5 by a thin oxide layer.

In this embodiment, pairs of transistors 3 belonging to the same column BL have a conduction terminal in common.

An insulating layer 8, e.g., of a doped oxide with boron and phosphorus (BPSG), is subsequently laid over the entire semiconductor surface.

The insulating layer 8 may be a layer of non-reflowed and/or planarized oxide obtained by a conventional CMP (Chemical Mechanical Polishing) process.

Formed through the insulating layer at the locations of the conduction terminals 6, are respective openings 9 for conventionally providing respective contacts 10.

Advantageously, the ferroelectric capacitive elements 4 are formed at each MOS transistor 3.

In a specially advantageous embodiment, each contact 10 is coated with a thin barrier metal layer 14, e.g., of titanium or titanium nitride or combination thereof (Ti/TiN).

The metal layer 14 would also line the edges of the openings 9.

The contact 10, thus coated, is then filled with a filler 15, which may either be a dielectric material such as silicon oxide or a conducting material such as tungsten W. Advantageously, an additional barrier layer 16, e.g., of iridium oxide $IrO_2$, restricts the filler in the opening 9.

At this stage the ferroelectric capacitive elements 4 are formed.

A metal layer 11a, e.g., of platinum, is deposited over the entire surface of the wafer. Using a conventional photolithographic technique, a plurality of lower electrodes 11 are defined.

These lower electrodes 11 are formed at contacts 10 connected to the first conduction terminals 6.

A layer of a ferroelectric material 12, such as barium titanate, is deposited over the whole wafer surface.

This layer 12 serves a dielectric function between the plates of the capacitive element 4.

A second metal layer 13a, e.g., of platinum, is deposited over the whole surface of the wafer. A plurality of upper electrodes 13 are defined by a conventional photolithographic technique.

A layer of a sealing material 17 is then deposited over the whole surface of the semiconductor; including the ferroelectric layer 12 and upper electrodes 13. A mask (not shown) is then placed on the sealing layer 17 and then both the ferroelectric layer 12 and sealing layer 17 are etched in a single step through apertures in the mask.

Advantageously, this sealing layer 17 is a layer of a material impermeable to hydrogen, so as to protect the ferroelectric material layer 12 against subsequent processing based on the use of hydrogen, which could affect the layer characteristics adversely. The sealing layer 17 also preferably is a material susceptible of etching with the ferroelectric layer 12 selectively with respect to the upper electrodes 13. Examples of such materials for the sealing layer 17 include ferroelectric materials, aluminum oxide, and a combination layer that includes a layer of TEOS and a layer of silicon nitride.

Advantageously, the ferroelectric material layer 12 is defined to completely cover the lower electrode 11 of the capacitive element 4. The sealing layer 17, in turn, completely covers the upper electrode 13 and ferroelectric layer 12 of the capacitive element.

In a modified embodiment of the invention, dielectric spacers 18 may be formed at the sides of the capacitive element 4 to seal off the dielectric layer 12.

The process of making the ferroelectric capacitive element 4 and non-volatile memory cells is then completed in a manner known in the art, by depositing successive insulating and metallization layers (Metal 1 and Metal 2).

Summarizing, the process described above allows a ferroelectric capacitive element to be advantageously sealed in a selective way, without adding any dedicated process steps to the standard process flow for fabricating semiconductor integrated circuits.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A process for selectively sealing a ferroelectric capacitive element incorporated in non-volatile memory cells being integrated in a semiconductor substrate, each memory cell comprising a MOS transistor, the process comprising the following steps:

forming said MOS transistor on the semiconductor substrate;

depositing an insulating layer over the substrate and MOS transistor;

depositing a first metal layer to form, using a photolithographic technique, a lower electrode of said ferroelectric-capacitive element;

depositing a layer of a dielectric material onto said first layer;

depositing a second metal layer to form, using a photolithographic technique, an upper electrode of said ferroelectric capacitive element;

depositing a layer of a sealing material onto said second metal layer, the sealing layer being impermeable to hydrogen; and defining the dielectric layer and sealing layer by a single photolithographic defining step, so as to pattern said dielectric layer and concurrently seal said ferroelectric capacitive element.

2. A process for sealing a ferroelectric capacitive element according to claim 1, wherein the dielectric material layer is a layer of a ferroelectric material.

3. A process for sealing a ferroelectric capacitive element according to claim 2, wherein the sealing material layer completely covers the lower electrode and upper electrode of said ferroelectric capacitive element.

4. A process for sealing a ferroelectric capacitive element according to claim 1, wherein the sealing layer is a layer of a ferroelectric material.

5. A process for sealing a ferroelectric capacitive element according to claim 1, wherein spacers are formed laterally of said ferroelectric capacitive element to seal the dielectric layer along its sides.

6. A process for sealing a ferroelectric capacitive element according to claim 5, wherein the spacers are formed from a ferroelectric material.

7. A process for sealing a ferroelectric capacitive element according to claim 1, wherein said lower electrode is connected to conduction terminals of said MOS transistor through a contact formed in an opening in the insulating layer, said contact comprising a metal layer lining the opening.

8. A process for sealing a ferroelectric capacitive element according to claim 7, wherein the opening is filled with a conducting material.

9. The process of claim 1 wherein the step of depositing a second metal layer to form an upper electrode includes forming the upper electrode such that the dielectric layer extends laterally beyond the upper electrode and wherein the step of depositing the sealing layer includes depositing the sealing layer directly on the dielectric layer such that the sealing layer and dielectric layer directly contact each other.

10. The process of claim 9 wherein the step of depositing the dielectric layer includes extending the dielectric layer beyond the lower electrode such that the dielectric layer contacts lateral sides of the lower electrode.

11. The process of claim 1 wherein defining the dielectric layer and sealing layer by a single photolithographic defining step includes placing over the sealing layer a mask having an aperture and etching the dielectric layer and sealing layer through the aperture in the mask.

12. A process for selectively sealing a ferroelectric capacitive element incorporated in non-volatile memory cells being integrated in a semiconductor substrate, each memory cell comprising a MOS transistor, the process comprising the following steps:

forming said MOS transistor on the semiconductor substrate;

depositing an insulating layer over the substrate and MOS transistor;

depositing a first metal layer to form, using a photolithographic technique, a lower electrode of said ferroelectric capacitive element;

depositing a layer of a dielectric material onto said first metal layer;

depositing a second metal layer to form, using a photolithographic technique, an upper electrode of said ferroelectric capacitive element;

depositing a layer of a sealing material onto said second metal layer, the sealing layer being impermeable to hydrogen; and defining the dielectric layer and sealing layer by a single photolithographic defining step, so as to pattern said dielectric layer and concurrently seal said ferroelectric capacitive element, wherein said lower electrode is connected to conduction terminals of said MOS transistor through a contact formed in an opening in the insulating layer, said contact comprising a metal layer lining the opening and wherein the opening is filled with an insulating material.

13. A process for selectively sealing a capacitive element incorporated in a non-volatile memory cell integrated in a semiconductor substrate, each memory cell comprising a MOS transistor, the process comprising:

forming the MOS transistor on the semiconductor substrate;

depositing an insulating layer over the substrate and MOS transistor;

forming a conductive lower electrode of the capacitive element on the insulating layer;

depositing a dielectric layer onto the lower electrode;

forming a conductive upper electrode of the ferroelectric capacitive element on the dielectric layer;

forming on the upper electrode a sealing layer that covers the capacitive element, the sealing layer being of a material that is impermeable to hydrogen;

connecting the lower electrode to a conduction terminal of the MOS transistor through a contact formed in an opening in the insulating layer, the contact comprising a metal layer lining the opening; and filling the opening with an insulating material positioned interiorly of the metal layer.

14. A process for selectively sealing a capacitive element incorporated in a non-volatile memory cell integrated in a semiconductor substrate, each memory cell comprising a MOS transistor, the process comprising:

forming the MOS transistor on the semiconductor substrate;

depositing an insulating layer over the substrate and MOS transistor;

forming a conductive lower electrode of the capacitive element on the insulating layer;

depositing a dielectric layer onto the lower electrode;

forming a conductive upper electrode of the ferroelectric capacitive element on the dielectric layer such that the dielectric layer extends laterally beyond the upper electrode;

forming on the upper electrode a sealing layer that covers the capacitive element and directly contacts the dielectric layer, the sealing layer being of a material that is impermeable to hydrogen.

15. The process of claim 14, wherein the dielectric layer is a layer of a ferroelectric material.

16. The process of claim 14, wherein the sealing material layer completely covers the lower and upper electrodes of the capacitive element, the process further comprising selectively etching the sealing layer to produce gaps through which hydrogen can reach the MOS transistor.

17. The process of claim 14, further comprising forming spacers laterally of the capacitive element to seal the dielectric layer along its sides.

18. The process of claim 14, wherein the sealing layer is a layer of a ferroelectric material.

19. The process of claim 14, further comprising connecting the lower electrode to a conduction terminal of the MOS transistor through a contact formed in an opening in the insulating layer, the contact comprising a metal layer lining the opening.

20. The process of claim 14 wherein forming the upper electrode includes forming the upper electrode such that the dielectric layer extends laterally beyond the upper electrode and wherein forming the sealing layer includes depositing the sealing layer directly on the dielectric layer such that a bottom surface of the sealing layer and a top surface of the dielectric layer directly contact each other.

21. The process of claim 9 wherein forming the dielectric layer includes extending the dielectric layer beyond the lower electrode such that the dielectric layer contacts lateral sides of the lower electrode.

22. The process of claim 14, further comprising placing over the sealing layer a mask having an aperture and etching the dielectric layer and sealing layer through the aperture in the mask.

* * * * *

UNITED STATES PATENT AND TRADEMARK OFFICE
CERTIFICATE OF CORRECTION

PATENT NO. : 6,579,727 B1  Page 1 of 1
DATED : June 17, 2003
INVENTOR(S) : Raffaele Zambrano It is certified that error appears in the above-identified patent and that said Letters Patent is hereby corrected as shown below:

Column 6,
Line 45, "The process of claim 9 wherein forming" should read as -- The process of claim 20 wherein depositing --.

Signed and Sealed this

Fourth Day of November, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,579,727 B1 Page 1 of 1
APPLICATION NO. : 09/710066
DATED : June 17, 2003
INVENTOR(S) : Raffaele Zambrano It is certified that error appears in the above-identified patent and that said Letters Patent is hereby corrected as shown below:

Column 6, Claim 14
Line 10-11 "of the ferroelectric capacitive element" should read as --of the capacitive element--.

Signed and Sealed this

Fourth Day of November, 2008

JON W. DUDAS
*Director of the United States Patent and Trademark Office*